(12) United States Patent
Choi et al.

(10) Patent No.: US 11,785,859 B2
(45) Date of Patent: Oct. 10, 2023

(54) VOLTAGE-CONTROLLED MAGNETORESISTANCE DEVICE COMPRISING LAYERED MAGNETIC MATERIAL AND LAYERED FERROELECTRIC MATERIAL

(71) Applicant: KOREA INSTITUTE OF SCIENCE AND TECHNOLOGY, Seoul (KR)

(72) Inventors: Jun Woo Choi, Seongnam-Si (KR); Sang Yeop Lee, Seoul (KR); Hyejin Ryu, Seoul (KR); Chaun Jang, Seoul (KR)

(73) Assignee: KOREA INSTITUTE OF SCIENCE AND TECHNOLOGY, Seoul (KR)

(*) Notice: Subject to any disclaimer, the term of this patent is extended or adjusted under 35 U.S.C. 154(b) by 304 days.

(21) Appl. No.: 17/163,829

(22) Filed: Feb. 1, 2021

(65) Prior Publication Data
US 2022/0123204 A1 Apr. 21, 2022

(30) Foreign Application Priority Data
Oct. 15, 2020 (KR) .......... 10-2020-0133133

(51) Int. Cl.
*H10N 50/10* (2023.01)
*H10N 50/01* (2023.01)
*H10N 50/80* (2023.01)
*H10N 50/85* (2023.01)

(52) U.S. Cl.
CPC ............. *H10N 50/10* (2023.02); *H10N 50/01* (2023.02); *H10N 50/80* (2023.02); *H10N 50/85* (2023.02)

(58) Field of Classification Search
CPC ......... H01L 43/08; H01L 43/02; H01L 43/10; H01L 43/12; H01F 10/08; H10N 50/10; H10N 50/80; H10N 50/85
See application file for complete search history.

(56) References Cited

U.S. PATENT DOCUMENTS

| | | | |
|---|---|---|---|
| 2015/0255135 A1* | 9/2015 | Tran ................. | H01L 43/12 365/158 |
| 2015/0303372 A1* | 10/2015 | Meade ............. | H01L 43/02 257/421 |
| 2018/0358542 A1* | 12/2018 | Mihajlovic ........ | G11C 11/1659 |
| 2020/0006637 A1* | 1/2020 | Gosavi ............. | H01L 43/10 |

* cited by examiner

*Primary Examiner* — Khiem D Nguyen
*Assistant Examiner* — Daniel Hyun Suh
(74) *Attorney, Agent, or Firm* — MARSHALL, GERSTEIN & BORUN LLP

(57) ABSTRACT

Proposed is a magnetoresistance device, including a first layered magnetic material layer in which a magnetization direction is controlled depending on the voltage, a second layered magnetic material layer in which a magnetization direction is fixed in a predetermined direction, and a layered insulator layer interposed between the first and second layered magnetic material layers.

13 Claims, 8 Drawing Sheets

100

1

200

VOLTAGE-CONTROLLED MAGNETORESISTANCE DEVICE COMPRISING LAYERED MAGNETIC MATERIAL AND LAYERED FERROELECTRIC MATERIAL

CROSS REFERENCE TO RELATED APPLICATION

The present application claims priority based on Korean Patent Application No. 10-2020-0133133, filed on Oct. 13, 2020, the entire content of which is incorporated herein for all purposes by this reference.

BACKGROUND OF THE DISCLOSURE

1. Technical Field

The national research and development projects supporting the present disclosure are as follows:
Project Serial Number: 1711097856
Project Number: CAP-16-01-KIST
Government Ministry: Ministry of Science and ICT
Research Management Institution: National Institute Council of Science & Technology
Research Project Name: Creative Allied Project (CAP)
Research Topic: Development of power-efficient high-speed spin memory technology using spin and quantum phenomena
Contribution Ratio: 60/100
Managing Institution: Korea Institute of Science and Technology
Research Period: 1 Jul. 2020 to 30 Jun. 2021
Project Serial Number: 1711119435
Project Number: NRF-2020R1A5A1104591
Government Ministry: Ministry of Science and ICT
Research Management Institution: National Research Foundation of Korea
Research Project Name: Project to support Science Research Center
Research Topic: Magnetic and topological materials for research on new Berry-curvature-based phenomena
Contribution Ratio: 20/100
Managing Institution: Korea Institute of Science and Technology
Research Period: 1 Jul. 2020 to 31 May 2021
Project Serial Number: 1711102170
Project Number: 2E30600
Government Ministry: Ministry of Science and ICT
Research Management Institution: Korea Institute of Science and Technology
Research Project Name: Project to develop future fundamental technology for next-generation semiconductor
Research Topic: Advanced information device using spin interface
Contribution Ratio: 20/100
Managing Institution: Korea Institute of Science and Technology
Research Period: 1 Jan. 2020 to 31 Dec. 2020

The present disclosure relates to a voltage-controlled magnetoresistance device including a layered magnetic material, and more particularly to a magnetoresistance device capable of controlling the magnetoresistance of a layered magnetic material using voltage.

2. Description of the Related Art

Recently, thorough research into the application of a layered magnetic material that has Van der Waals bonding and is thus easily separated in two dimensions to a magnetoresistance device is ongoing. In particular, it has been found that a layered magnetic material such as $CrI_3$ or $CrGeTe_3$ retains the magnetic properties thereof even at a thickness of a single atomic layer due to magnetic anisotropy based on spin-orbital coupling.

Moreover, various layered magnetic materials such as $CrSiTe_3$, $VSe_2$, $Fe_3GeTe_2$, $Fe_5GeTe_2$, $MnSe_2$ and the like are currently being discovered, and research to improve properties (Curie temperature, magnetization, coercivity, etc.) so as to enable application to magnetic devices through methods such as electron/hole doping or application of strain thereto is actively underway. As a magnetoresistance device using such a layered magnetic material, a spin valve device using $Fe_3GeTe_2$ or a spin filter device having a tunneling magnetoresistance of $CrI_3$ of 1,000,000% has been developed.

Meanwhile, recent studies have found a phase transition phenomenon between antiferromagnetic and ferromagnetic states in $CrI_3$, which is a layered magnetic material, achieved using an electric field and doping. Also, studies on controlling the Curie temperature, exchange interaction strength and the like of layered magnetic materials such as $CrI_3$, $Fe_3GeTe_2$ and the like using an electric field have been reported.

However, study on the control of magnetic properties of layered magnetic materials using an electric field is in the very early stages. In particular, since layered magnetic materials have very high magnetic anisotropy, it is difficult to implement the spin-switching operation in an electrical manner. Therefore, in order to develop an ultralow-power magnetoresistance device based on a layered material, there is a need to develop technology for reversibly changing the switching field (coercivity) using an electric field.

SUMMARY OF THE DISCLOSURE

Accordingly, an embodiment of the present disclosure is intended to provide a magnetoresistance device capable of controlling the magnetoresistance of a layered magnetic material using voltage.

Exemplary embodiments of the present disclosure provide a magnetoresistance device, including: a first layered magnetic material layer in which a magnetization direction is controlled depending on the voltage; a second layered magnetic material layer in which a magnetization direction is fixed in a predetermined direction; and a layered insulator layer interposed between the first layered magnetic material layer and the second layered magnetic material layer.

Here, the planes of the first layered magnetic material layer, the second layered magnetic material layer, and the layered insulator layer may be parallel to each other.

Here, the first layered magnetic material layer may have lower coercivity than the second layered magnetic material layer.

Here, the first layered magnetic material layer may include at least one selected from among $Fe_xGeTe_2$ (in which x is 2.7 to 5), $Cr_2Ge_2Te_6$, $Cr_2Si_2Te_6$, $CrI_3$, $CrBr_3$, $VSe_2$, and $MnSe_x$ (in which x is 1 to 2).

Here, the second layered magnetic material layer may include at least one selected from among $Fe_{0.25}TaS_2$ and $Fe_xGeTe_2$ (in which x is 2.7 to 5).

Here, the voltage may be applied between the first layered magnetic material layer and the second layered magnetic material layer, and the magnetization direction of the first layered magnetic material layer may be controlled by an electric field generated by the voltage in a state in which a magnetic field of a predetermined magnitude is applied.

Here, the magnetization direction of the first layered magnetic material layer may be controlled to be identical to or opposite that of the second layered magnetic material layer depending on a change in the magnitude of the voltage.

Here, the magnetic field may be applied at a predetermined magnitude within a range between the switching field of the first layered magnetic material layer when the voltage is applied at a first level and the switching field of the first layered magnetic material layer when the voltage is applied at a second level.

Here, the layered insulator layer may include hexagonal boron nitride.

Here, the magnetoresistance device may further include a layered metal layer and a layered ferroelectric material layer interposed between the first layered magnetic material layer and the layered metal layer.

Here, the voltage may be applied between the first layered magnetic material layer and the layered metal layer, and the magnetization direction of the first layered magnetic material layer may be controlled by polarization generated in the layered ferroelectric material layer by the voltage.

Here, the magnetization direction of the first layered magnetic material layer may be controlled to be identical to or opposite that of the second layered magnetic material layer, depending on the direction of the polarization.

Here, the layered ferroelectric material layer may include at least one selected from among $CuInP_2S_6$, $CuCrP_2S_6$ and $CrCl_2$. Here, the layered metal layer may include graphene.

Here, the planes of the layered ferroelectric material layer and the layered metal layer may be parallel to each other.

The disclosed technology can have the following effects.

However, since it does not mean that a specific embodiment has to include all the following effects or only the following effects, the scope of the disclosed technology is not to be construed as being limited thereby.

The magnetoresistance device according to an embodiment of the present disclosure is capable of controlling the magnetoresistance of a layered magnetic material using voltage.

DESCRIPTION OF SPECIFIC EMBODIMENTS

Hereinafter, a detailed description will be given of embodiments of the present disclosure with reference to the accompanying drawings.

Figure 1:
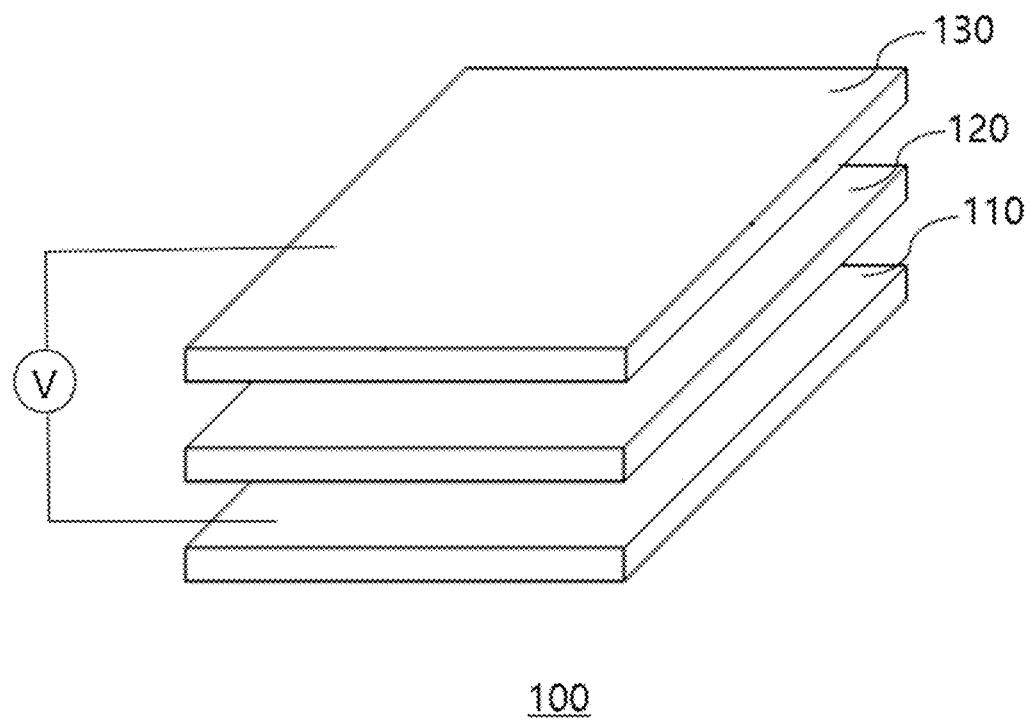
FIG. 1 shows a magnetoresistance device according to an embodiment of the present disclosure.

FIG. 1 shows a magnetoresistance device according to an embodiment of the present disclosure.

Referring to FIG. 1, the magnetoresistance device 100 according to an embodiment of the present disclosure includes a first layered magnetic material layer 110, a layered insulator layer 120, and a second layered magnetic material layer 130. Each of the first layered magnetic material layer 110, the layered insulator layer 120, and the second layered magnetic material layer 130 may be bound through Van der Waals interactions, and may be formed of a plurality of layers capable of being separated in two dimensions. The planes of the first layered magnetic material layer 110, the layered insulator layer 120, and the second layered magnetic material layer 130 may be parallel to each other. The interface between the first layered magnetic material layer 110 and the layered insulator layer 120 and the interface between the layered insulator layer 120 and the second layered magnetic material layer 130 may form a heterojunction.

The first layered magnetic material layer 110 may be formed of a ferromagnetic material (FM). The first layered magnetic material layer 110 may be formed of a magnetic material having lower coercivity than the second layered magnetic material layer 130. The first layered magnetic material layer 110 may include at least one selected from among $Fe_xGeTe_2$ (in which x is 2.7 to 5), $Cr_2Ge_2Te_6$, $Cr_2Si_2Te_6$, $CrI_2$, $CrBr_3$, $VSe_2$, and $MnSe_x$ (in which x is 1 to 2).

The first layered magnetic material layer 110 operates as a free layer in which a magnetization direction (spin direction) is capable of changing under an electric field generated by the applied voltage. The magnetization direction of the first layered magnetic material layer 110 may be controlled in an upward or downward direction depending on the magnitude of the voltage V applied between the first and second layered magnetic material layers 110, 130 in the state in which a magnetic field of a predetermined magnitude is applied.

Here, in an embodiment of the present disclosure, a magnetic field of a predetermined magnitude may be applied to the magnetoresistance device 100 using a separate means for generating a magnetic field (not shown). The magnitude of the magnetic field applied to the magnetoresistance device 100 may be determined by the switching field of the first layered magnetic material layer 110, which changes depending on the magnitude of the voltage V. For example, voltage may be applied at a predetermined magnitude within the magnetic field range between the switching field of the first layered magnetic material layer 110 when a voltage V is applied at a first level and the switching field of the first layered magnetic material layer 110 when a voltage V is applied at a second level different from the first level. Here, when $Fe_3GeTe_2$ (FGT) is used for the first layered magnetic material layer 110, the magnetic properties in which the switching field is changed by voltage (electric field) are described in detail based on the experimental results of FIGS. 2A to 2C.

The layered insulator layer 120 is interposed between the first and second layered magnetic material layers 110, 130. The layered insulator layer 120 may be formed of an insulator. Here, the layered insulator layer 120 may include hexagonal boron nitride (h-BN).

The second layered magnetic material layer 130 may be formed of a ferromagnetic material. The second layered magnetic material layer 130 may be formed of a magnetic material having higher coercivity than the first layered magnetic material layer 110. The second layered magnetic material layer 130 may include at least one selected from among $Fe_{0.25}TaS_2$ and $Fe_xGeTe_2$ (in which x is 2.7 to 5). The second layered magnetic material layer 130 operates as a pinned layer in which the switching field is as large as 1 T or more and the magnetization direction (spin direction) is fixed in a predetermined direction (upward direction).

Figure 2A:
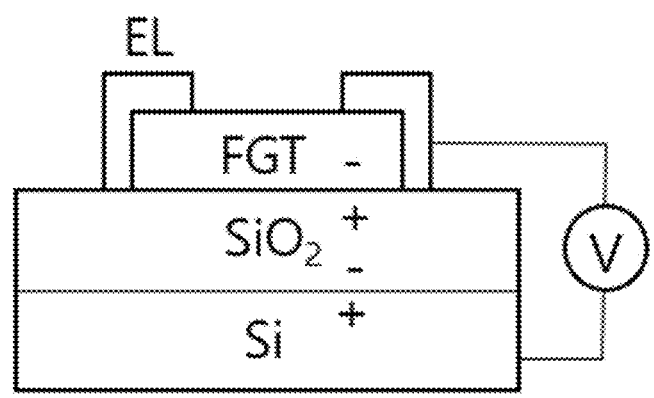
FIGS. 2A to 2C show magnetic properties in which the switching field of a layered magnetic material is changed by an electric field.
Figure 2B:
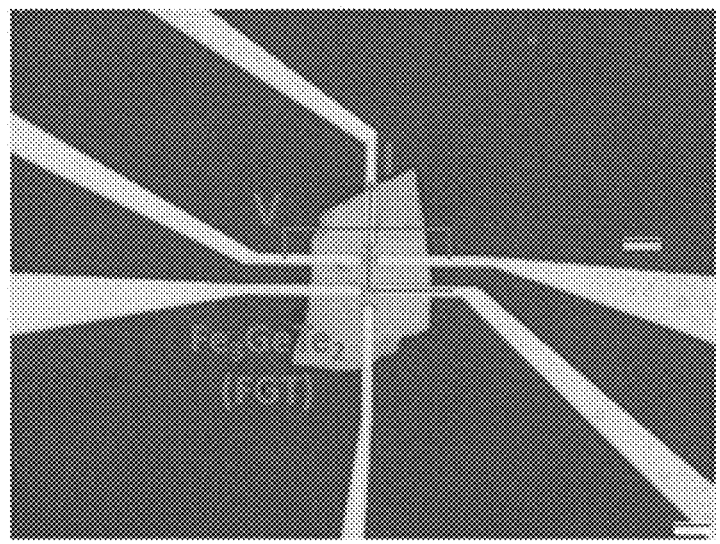
Figure 2C:
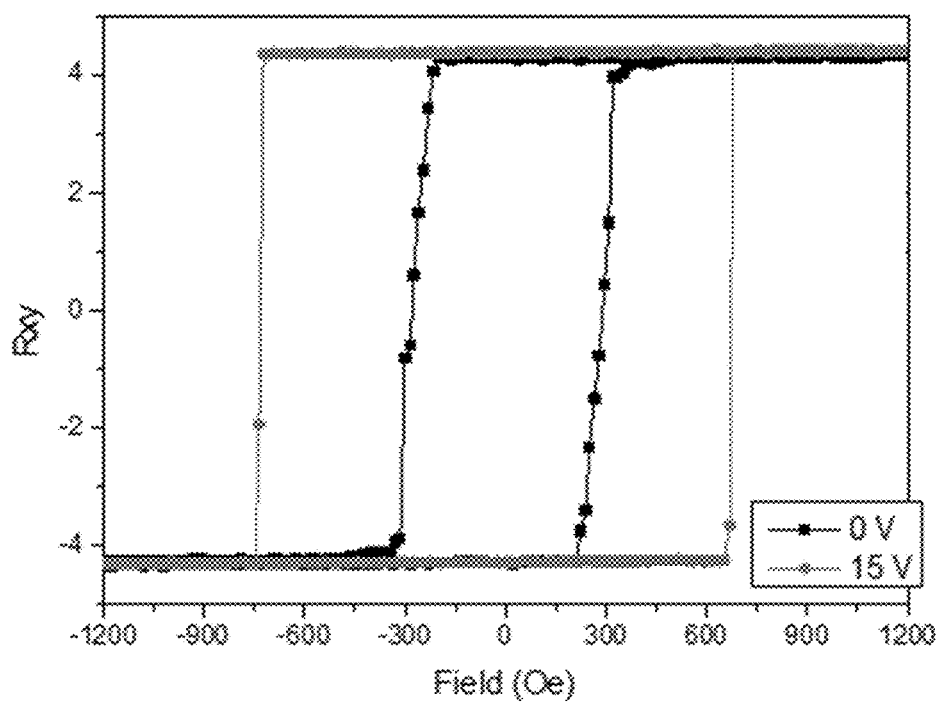

FIGS. 2A to 2C show magnetic properties in which the switching field of the layered magnetic material is changed by an electric field. FIG. 2A schematically shows a device manufactured from the layered magnetic material, FIG. 2B is an optical microscope image of the device shown in FIG. 2A, and FIG. 2C shows a change in a magnetic hysteresis loop depending on an electric field.

In FIGS. 2A and 2B, $Fe_3GeTe_2$ (FGT), which is a layered magnetic material, is manufactured into a magnetoresistance device 1, and the magnetic properties thereof are measured while voltage is applied to the magnetoresistance device 1 using an anomalous Hall effect (AHE) and a magneto-optical Kerr effect (MOKE). Here, the magnetoresistance device 1 may be manufactured in a manner in which FGT is thinly separated through a physical exfoliation process and is then transferred onto a silicon substrate (Si) having an oxide layer ($SiO_2$), after which electrodes (EL) are deposited through e-beam lithography and sputtering.

Based on the results of observation of a change in the switching field by applying the back gate voltage V at different levels to the magnetoresistance device 1 manufactured as described above, as shown in FIG. 2C, it can be seen that the switching field (coercivity) of 300 Oe at 0 V is greatly changed to 750 Oe when the back gate voltage V is applied at +15 V. Briefly, it can be found that the switching field of the layered magnetic material is capable of changing greatly depending on the voltage.

Figure 3A:
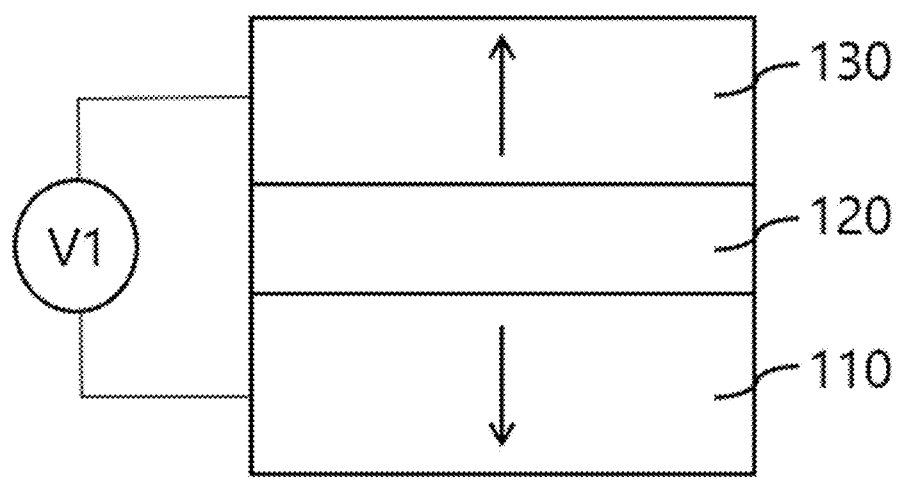
FIG. 3A shows a magnetization direction when a voltage V1 is applied to the magnetoresistance device according to an embodiment of the present invention.
Figure 3B:
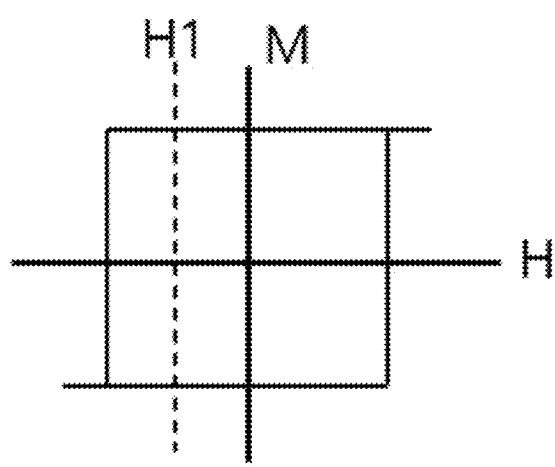
FIG. 3B shows a magnetic hysteresis loop in the second layered magnetic material layer shown in FIG. 3A.
Figure 3C:
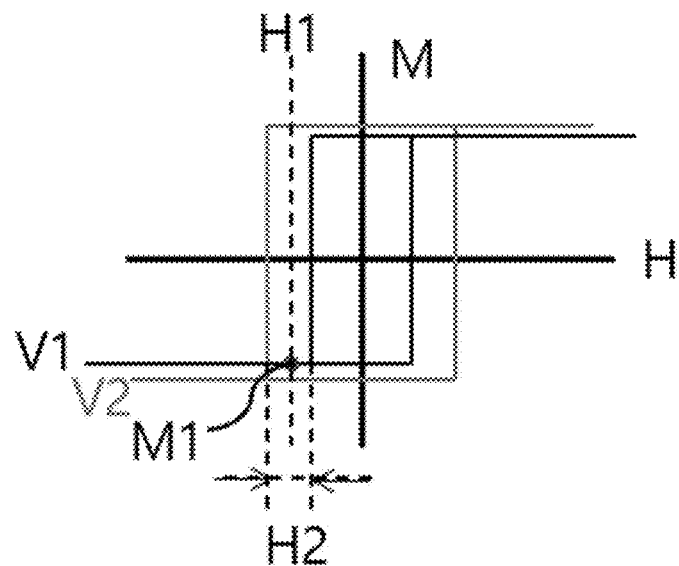
FIG. 3C shows a magnetic hysteresis loop in the first layered magnetic material layer shown in FIG. 3A.

FIG. 3A shows a magnetization direction when a voltage V1 is applied to the magnetoresistance device according to an embodiment of the present invention, FIG. 3B shows a magnetic hysteresis loop in the second layered magnetic material layer shown in FIG. 3A, and FIG. 3C shows a magnetic hysteresis loop in the first layered magnetic material layer shown in FIG. 3A.

In FIGS. 3A to 3C, when a voltage V is applied at a low level V1 between the first and second layered magnetic material layers 110, 130 in the state in which a magnetic field H1 of a predetermined magnitude is applied to the magnetoresistance device 100, the magnetization M1 of the first layered magnetic material layer 110 is controlled in a downward direction, as indicated by the arrow. Here, the magnetic field applied to the magnetoresistance device 100 may fall within the range H2 between the switching field at the low voltage level V1 and the switching field at the high voltage level V2 of the first layered magnetic material layer 110.

As such, the magnetization direction of the second layered magnetic material layer 130 is fixed in an upward direction. Therefore, since the magnetization direction of the first layered magnetic material layer 110 is opposite that of the second layered magnetic material layer 130 (non-equilibrium), the magnetoresistance of the magnetoresistance device 100 has a relatively large value, and this value is read as "1". Here, the magnetoresistance of the magnetoresistance device 100 may be measured at both ends of the first and second layered magnetic material layers 110, 130 using a tunneling magnetoresistance (TMR) effect in which resistance is determined depending on the relative magnetization directions of the first and second layered magnetic material layers 110, 130.

Figure 4A:
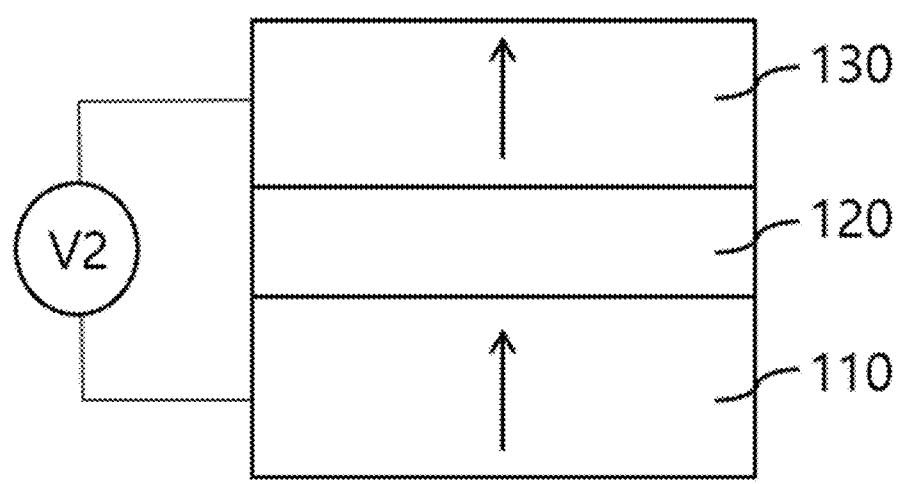
FIG. 4A shows a magnetization direction when a voltage V2 is applied to the magnetoresistance device according to an embodiment of the present invention.
Figure 4B:
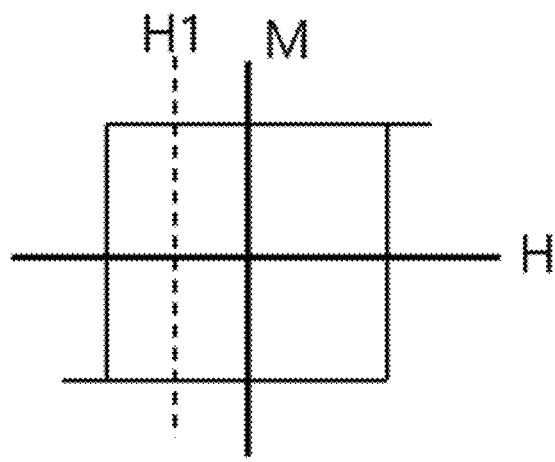
FIG. 4B shows a magnetic hysteresis loop in the second layered magnetic material layer shown in FIG. 4A.
Figure 4C:
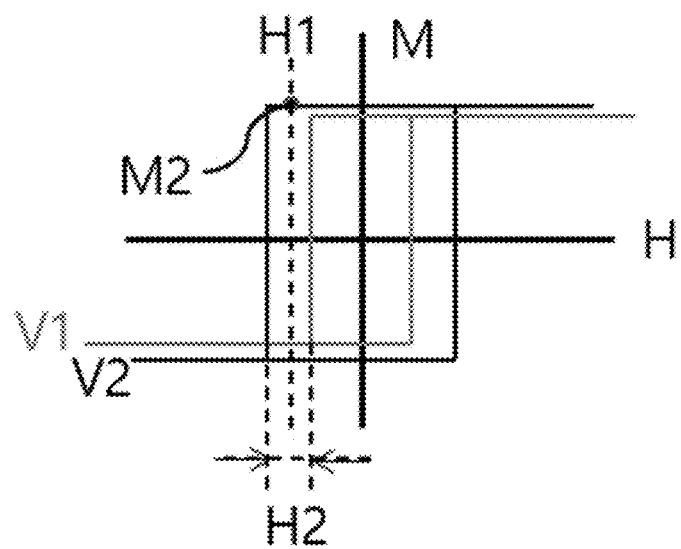
FIG. 4C shows a magnetic hysteresis loop in the first layered magnetic material layer shown in FIG. 4A.

FIG. 4A shows a magnetization direction when a voltage V2 is applied to the magnetoresistance device according to an embodiment of the present invention, FIG. 4B shows a magnetic hysteresis loop in the second layered magnetic material layer shown in FIG. 4A, and FIG. 4C shows a magnetic hysteresis loop in the first layered magnetic material layer shown in FIG. 4A.

In FIGS. 4A to 4C, when a voltage V is applied at a high level V2 (V2>V1) between the first and second layered magnetic material layers 110, 130 in the state in which a magnetic field H1 of a predetermined magnitude is applied to the magnetoresistance device 100, the magnetization M2 of the first layered magnetic material layer 110 is controlled in an upward direction, as indicated by the arrow. As such, the magnetization direction of the second layered magnetic material layer 130 is fixed in an upward direction. Therefore, since the magnetization direction of the first layered magnetic material layer 110 is identical to that of the second layered magnetic material layer 130 (equilibrium), the magnetoresistance of the magnetoresistance device 100 has a relatively small value, and this value is read as "0".

Specifically, the magnetization direction of the first layered magnetic material layer 110 according to an embodiment of the present disclosure is controlled by the electric field generated by the applied voltage V. Thereby, it is possible to implement the magnetoresistance device 100 in which the magnetoresistance is controlled depending on the voltage (electric field).

Figure 5:
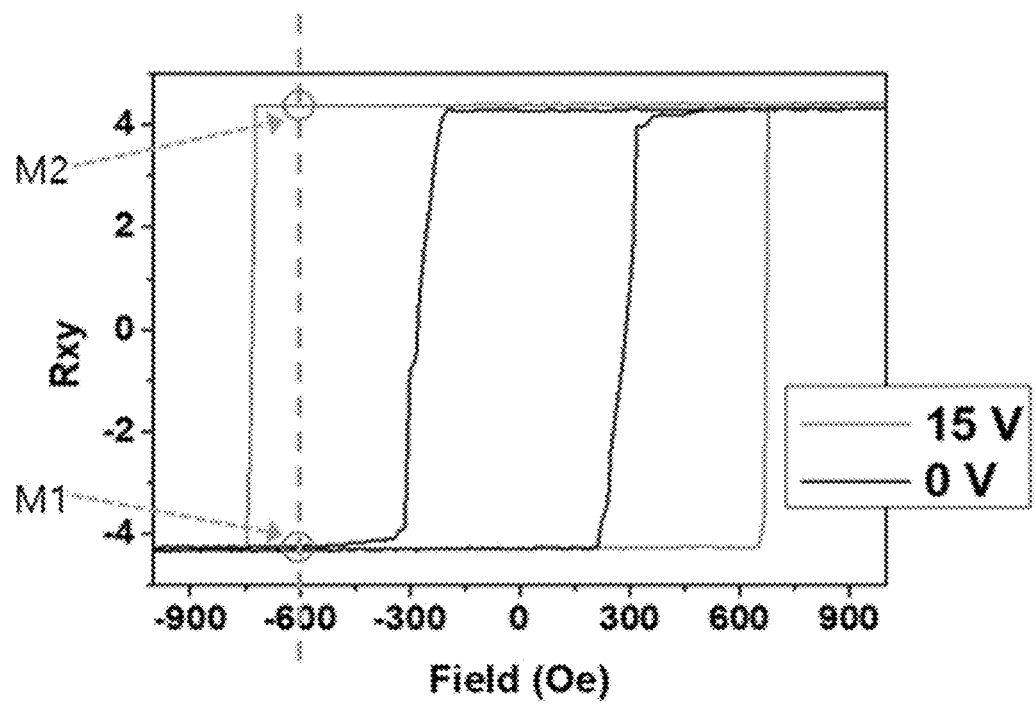
FIG. 5 exemplarily shows the driving of the magnetoresistance device according to an embodiment of the present invention.

FIG. 5 exemplarily shows the driving of the magnetoresistance device according to an embodiment of the present disclosure.

In FIG. 5, when a voltage V is applied from 0 V to +15 V in the state in which a magnetic field of −600 Oe is applied to the magnetoresistance device 100, the magnetization of the first layered magnetic material layer 110 may be changed from the downward direction M1 to the upward direction M2. Therefore, it is possible to control the magnetoresistance of the magnetoresistance device 100 depending on the voltage V.

FIGS. 6A to 6D show the process of manufacturing the magnetoresistance device according to an embodiment of the present disclosure.

Figure 6A:
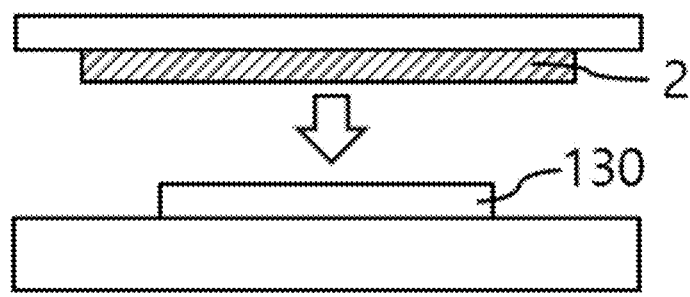
FIGS. 6A to 6D show a process of manufacturing the magnetoresistance device according to an embodiment of the present disclosure.

In FIG. 6A, each of the first layered magnetic material layer 110, the layered insulator layer 120, and the second layered magnetic material layer 130 is separated into a thin film using a physical exfoliation process. Thereafter, the second layered magnetic material layer 130 is picked up using a polymer support layer 2.

Figure 6B:
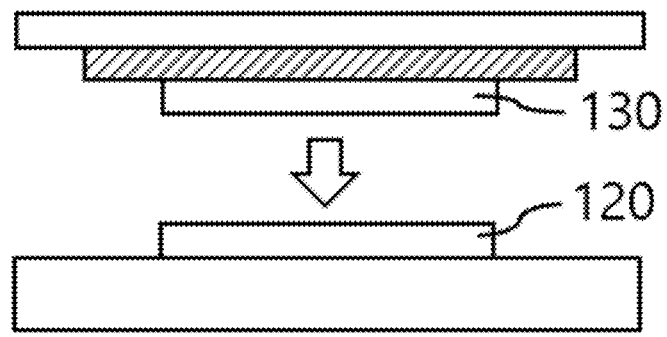
Figure 6C:
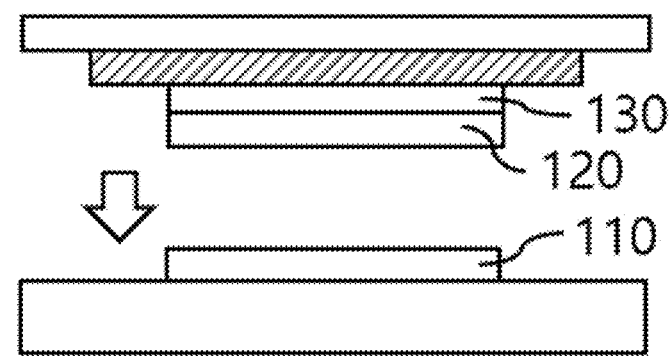
Figure 6D:
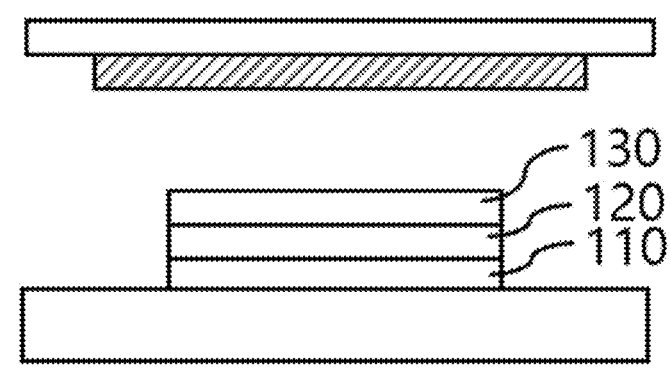

In this state, as shown in FIG. 6B, the layered insulator layer 120 is also picked up using the polymer support layer 2, and is then transferred onto the first layered magnetic material layer 110, as shown in FIG. 6C. Thereby, as shown in FIG. 6D, a magnetoresistance device 100 in which the first layered magnetic material layer 110, the layered insulator layer 120, and the second layered magnetic material layer 130 are bound through heterojunction may be manufactured.

The manufacturing of the magnetoresistance device 100 using a physical exfoliation process and a dry transfer process according to an embodiment of the present disclosure is exemplarily described, but an embodiment of the present disclosure is not limited thereto, and it is also possible to apply other manufacturing methods capable of manufacturing a junction structure between heterogeneous materials.

Figure 7:
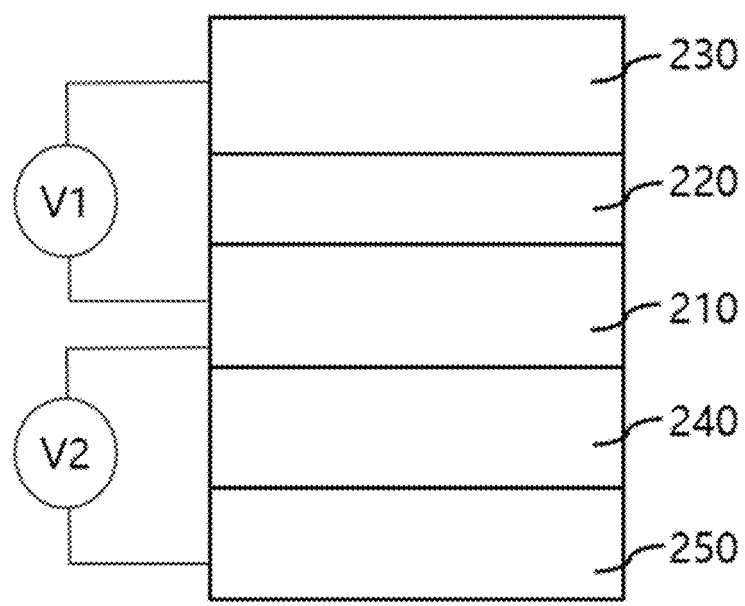
FIG. 7 shows a magnetoresistance device according to another embodiment of the present disclosure.

FIG. 7 shows a magnetoresistance device according to another embodiment of the present disclosure.

With reference to FIG. 7, a magnetoresistance device 200 according to another embodiment of the present disclosure includes a first layered magnetic material layer 210, a layered insulator layer 220, a second layered magnetic material layer 230, a layered ferroelectric material layer 240, and a layered metal layer 250. Each of the first layered magnetic material layer 210, the layered insulator layer 220, the second layered magnetic material layer 230, the layered ferroelectric material layer 240 and the layered metal layer 250 may be bound through van der Waals interactions, and may be formed of a plurality of layers capable of being separated in two dimensions.

The planes of the first layered magnetic material layer 210, the layered insulator layer 220, the second layered magnetic material layer 230, the layered ferroelectric material layer 240 and the layered metal layer 250 may be parallel to each other. Moreover, individual interfaces between the first layered magnetic material layer 210, the layered insulator layer 220, the second layered magnetic material layer 230, the layered ferroelectric material layer 240 and the layered metal layer 250 may form a heterojunction.

The first layered magnetic material layer 210 may be formed of a ferromagnetic material. Here, the first layered magnetic material layer 210 may be formed of a magnetic material having lower coercivity than the second layered magnetic material layer 230. The first layered magnetic material layer 210 may include at least one selected from among $Fe_xGeTe_2$ (in which x is 2.7 to 5), $Cr_2Ge_2Te_6$, $Cr_2Si_2Te_6$, $CrI_3$, $CrBr_3$, $VSe_2$, and $MnSe_x$ (in which x is 1 to 2). The first layered magnetic material layer 210 operates as a free layer in which the magnetization direction (spin direction) is capable of changing by the voltage V2 applied between the first layered magnetic material layer 210 and the layered metal layer 250. The magnetization direction of the first layered magnetic material layer 210 according to another embodiment of the present disclosure may be controlled depending on the direction of polarization generated in the layered ferroelectric material layer 240 by the voltage V2.

The layered insulator layer 220 is interposed between the first and second layered magnetic material layers 210, 230. The layered insulator layer 220 may be formed of an insulator. Here, the layered insulator layer 220 may include hexagonal boron nitride (h-BN).

The second layered magnetic material layer 230 may be formed of a ferromagnetic material. The second layered magnetic material layer 230 may be formed of a magnetic material having higher coercivity than the first layered magnetic material layer 210. The second layered magnetic material layer 230 may include at least one selected from among $Fe_{0.25}TaS_2$ and $Fe_xGeTe_2$ (in which x is 2.7 to 5). The second layered magnetic material layer 230 operates as a pinned layer in which the switching field is as large as 1 T or more and thus the magnetization direction (spin direction) is fixed in a predetermined direction (upward direction).

The layered ferroelectric material layer 240 is bound to the first layered magnetic material layer 210 and controls the magnetization direction of the first layered magnetic material layer 210 using the voltage V2 applied between the first layered magnetic material layer 210 and the layered metal layer 250. The layered ferroelectric material layer 240 may include at least one selected from among $CuInP_2S_6$, $CuCrP_2S_6$, and $CrCl_2$.

The layered metal layer 250 is bound to the layered ferroelectric material layer 240. The layered metal layer 250 may operate as an electrode, and may include graphene.

In the magnetoresistance device 200 having the above structure, when a voltage V2 is applied between the first layered magnetic material layer 210 and the layered metal layer 250, polarization is generated in the layered ferroelectric material layer 240. Here, the direction of polarization generated in the layered ferroelectric material layer 240 may be determined by the direction (+, −) of the voltage V2.

The polarization thus generated functions as an electric field, and a change in electron density is induced at the interface between the first layered magnetic material layer 210 and the layered ferroelectric material layer 240 by the polarization. Thereby, the magnetization direction of the first layered magnetic material layer 210 is controlled in an upward or downward direction. For example, when the voltage V2 is applied at a high voltage level (+15 V), the magnetization direction of the first layered magnetic material layer 210 may be controlled in an upward direction, and when the voltage V2 is applied at a low voltage level (−15 V), the magnetization direction of the first layered magnetic material layer 210 may be controlled in a downward direction.

Specifically, in the magnetoresistance device 200 according to another embodiment of the present disclosure, rather than controlling the magnetization direction of the first layered magnetic material layer 210 with an electric field generated by the voltage V1, polarization, functioning as an electric field, is generated in the layered ferroelectric material layer 240 by the voltage V2 such that the magnetization direction of the first layered magnetic material layer 210 is controlled. Since the polarization generated in the layered ferroelectric material layer 240 is maintained even when the voltage V2 is removed, separate application of a magnetic field is unnecessary, unlike the aforementioned embodiment of the present disclosure.

Moreover, the magnetoresistance of the magnetoresistance device 200 according to another embodiment of the present disclosure may be measured using the voltage V1 applied between the first and second layered magnetic material layers 210, 230. Specifically, in another embodiment of the present disclosure, the magnetoresistance value of the magnetoresistance device 200 is read using the voltage V1, and the magnetization direction of the first layered magnetic material layer 210 is controlled using the voltage V2, and thus the magnetoresistance value thereof is controlled.

Although the present disclosure has been described in detail through preferred embodiments thereof, the present disclosure is not limited thereto, and it will be apparent to those skilled in the art that various modifications and applications are possible within the scope of the present disclosure. Therefore, the scope of the present disclosure is to be interpreted by the following claims, and all technical ideas within the scope equivalent thereto are to be construed as being included in the scope of the present disclosure.

What is claimed is:

1. A magnetoresistance device, comprising:
a first layered magnetic material layer in which a magnetization direction is controlled depending on a voltage;
a second layered magnetic material layer in which a magnetization direction is fixed in a predetermined direction;
a layered insulator layer interposed between the first layered magnetic material layer and the second layered magnetic material layer;
a layered metal layer; and
a layered ferroelectric material layer interposed between the first layered magnetic material layer and the layered metal layer,
wherein the layered ferroelectric material layer comprises at least one selected from among $CuInP_2S_6$, $CuCrP_2S_6$, and $CrCl_2$.

2. The magnetoresistance device of claim 1, wherein planes of the first layered magnetic material layer, the second layered magnetic material layer, and the layered insulator layer are parallel to each other.

3. The magnetoresistance device of claim 1, wherein the first layered magnetic material layer has a lower coercivity than the second layered magnetic material layer.

4. The magnetoresistance device of claim 3, wherein the first layered magnetic material layer comprises at least one selected from among $Fe_xGeTe_2$ (in which x is 2.7 to 5), $Cr_2Ge_2Te_6$, $Cr_2Si_2Te_6$, $CrI_2$, $CrBr_3$, $VSe_2$, and $MnSe_x$ (in which x is 1 to 2).

5. The magnetoresistance device of claim 3, wherein the second layered magnetic material layer comprises at least one selected from among $Fe_{0.25}TaS_2$ and $Fe_xGeTe_2$ (in which x is 2.7 to 5).

6. The magnetoresistance device of claim 1, wherein the voltage is applied between the first layered magnetic material layer and the second layered magnetic material layer, and the magnetization direction of the first layered magnetic material layer is controlled by an electric field generated by the voltage in a state in which a magnetic field of a predetermined magnitude is applied.

7. The magnetoresistance device of claim 6, wherein the magnetization direction of the first layered magnetic material layer is controlled to be identical to or opposite the magnetization direction of the second layered magnetic material layer depending on a change in a magnitude of the voltage.

8. The magnetoresistance device of claim 6, wherein the magnetic field is applied at a predetermined magnitude within a range between a switching field of the first layered magnetic material layer when the voltage is applied at a first level and a switching field of the first layered magnetic material layer when the voltage is applied at a second level.

9. The magnetoresistance device of claim 1, wherein the layered insulator layer comprises hexagonal boron nitride.

10. The magnetoresistance device of claim 1, wherein the voltage is applied between the first layered magnetic material layer and the layered metal layer, and the magnetization direction of the first layered magnetic material layer is controlled by polarization generated in the layered ferroelectric material layer by the voltage.

11. The magnetoresistance device of claim 10, wherein the magnetization direction of the first layered magnetic material layer is controlled to be identical to or opposite the magnetization direction of the second layered magnetic material layer depending on a direction of the polarization.

12. The magnetoresistance device of claim 1, wherein the layered metal layer comprises graphene.

13. The magnetoresistance device of claim 1, wherein planes of the layered ferroelectric material layer and the layered metal layer are parallel to each other.

* * * * *